United States Patent
Kikuchi et al.

[11] Patent Number: 6,018,305
[45] Date of Patent: Jan. 25, 2000

[54] SERIAL TO PARALLEL CONVERSION APPARATUS WITH MEANS TO ADJUST THE PHASE OF A PLURALITY OF DIVIDED CLOCK SIGNALS

[75] Inventors: Hidekazu Kikuchi; Tohru Takeshita, both of Kanagawa, Japan

[73] Assignee: Sony Corporation, Japan

[21] Appl. No.: 09/172,622

[22] Filed: Oct. 15, 1998

[30] Foreign Application Priority Data

Oct. 15, 1997 [JP] Japan ..................................... 9-282360

[51] Int. Cl.[7] ..................................................... H03M 9/00
[52] U.S. Cl. ............................................ 341/100; 341/106
[58] Field of Search ..................................... 341/100, 101, 341/106

[56] References Cited

U.S. PATENT DOCUMENTS

| | | | |
|---|---|---|---|
| 5,561,423 | 10/1996 | Morisaki ................................. | 341/100 |
| 5,726,990 | 3/1998 | Shimada et al. ........................ | 370/536 |
| 5,774,079 | 6/1998 | Zirngibl ................................. | 341/100 |
| 5,808,571 | 9/1998 | Kuwata et al. ......................... | 341/100 |

*Primary Examiner*—Brian Young
*Assistant Examiner*—Peguy Jean Pierre
*Attorney, Agent, or Firm*—Rader, Fishman & Grauer; Ronald P. Kananen

[57] ABSTRACT

The invention provides a serial to parallel conversion apparatus which can perform desired serial to parallel conversion processing at a high speed while it has a simple and small-scale circuit configuration. The serial to parallel conversion apparatus includes a first divider for dividing a first clock signal into 2 to produce a second clock signal and adjusting the phase of the second signal in accordance with a first phase adjustment signal, a first serial to parallel converter for converting serial data into parallel data of 2 bits in response to the second clock signal, a pair of shift registers for receiving and storing the different bits of the parallel data and successively shifting the stored bits in response to the second clock signal, a second divider for dividing the second clock signal into 4 to produce a third clock signal, a second detector for producing the first phase adjustment signal and the second phase adjustment signal based on the stored data of the shift registers, and a pair of second serial to parallel converters for receiving the different bits of the parallel data and each producing first parallel data of 4 bits in response to the third clock signal.

7 Claims, 7 Drawing Sheets

SERIAL TO PARALLEL CONVERSION APPARATUS WITH MEANS TO ADJUST THE PHASE OF A PLURALITY OF DIVIDED CLOCK SIGNALS

BACKGROUND OF THE INVENTION

This invention relates to a serial to parallel conversion apparatus.

For example, a video signal of three primary colors of R (red), G (green) and B (blue) is sometimes transmitted as serial data over a monitor cable of copper lines and then converted into parallel data by a receiver.

In this instance, the receiver has a serial to parallel conversion apparatus incorporated therein for converting serial data into parallel data.

A serial to parallel conversion apparatus of the type mentioned detects word boundary indication data which is a reserved word of a special bit train which is intermittently included in inputted serial data and indicates a boundary position of a word, delimits the serial data at a correct word boundary in accordance with a result of the detection, converts the delimited serial data into parallel data and outputs the parallel data.

FIG. 7 is a block diagram of an exemplary one of conventional serial to parallel conversion apparatus.

Referring to FIG. 7, the serial to parallel conversion apparatus denoted at 1 includes an K-bit shift resister 2, a serial to parallel converter 3, a divider 4 for dividing a clock signal CLK into N, and a detector 5.

In the serial to parallel conversion apparatus 1, serial data SD of 1 bit are inputted to the shift register 2 in response to the clock signal CLK, and the thus inputted SD are stored by the shift register 2 and successively shifted in K flip-flops $2a_1$ to $2a_K$ which compose the shift register 2.

In the shifting operation, outputs of the flip-flops $2a_1$ to $2a_K$ are monitored by the detector 5 so that it is determined whether or not the outputs represent word boundary indication data.

Then, if the detector 5 detects the word boundary indication data, then the divider 4 is cleared (reset), and then an N-divided clock signal S4 obtained by dividing the clock signal CLK into N by the divider 4 with reference to the timing at which the divider 4 is cleared is outputted to the serial to parallel converter 3. The serial to parallel converter 3 converts the serial data of N bits inputted from the shift register 2 into parallel data PD with reference to the N-divided clock signal S4 and outputs the parallel data PD.

FIG. 8 is a block diagram showing another exemplary one of conventional serial to parallel conversion apparatus.

Referring to FIG. 8, the serial to conversion apparatus denoted at 11 includes N shift registers $12a_1$ to $12a_N$ a serial to parallel converter 3, a divider 4 and a detector 15.

In 1:N serial to parallel conversion, word boundary indication data can possibly be detected at N different positions in accordance with an initial phase of the divider 4. In the serial to parallel conversion apparatus 11, an N-bit parallel signal S3 is inputted parallelly from the serial to parallel converter 3 to the N shift registers $12a_1$ to $12a_N$ and is successively shifted in the shift registers $12a_1$ to $12a_N$. Then, the detector 15 detects a phase displacement between the word boundary indication data and the conversion processing of the serial to parallel converter 3 from the stored data of the shift registers $12a_1$ to $12a_N$ and if a phase displacement is detected, then the phase of the divider 4 is modified.

However, the serial to parallel conversion apparatus 1 shown in FIG. 7 has a problem in that the detector 5 is required to detect in one period corresponding to the clock signal CLK whether or not the word boundary indication data is stored in the shift register 2 and it is difficult to design a detector to be used as the detector 5 so that it allows high speed processing.

Meanwhile, the serial to parallel conversion apparatus 11 shown in FIG. 8 has a different problem in that, where 1:N serial to parallel conversion is performed, there is the possibility that the word boundary indication data may be detected from N different positions and, in order to detect all of such data, a large integration scale is required for the circuit. The serial to parallel conversion apparatus 11 has another problem in that modifying the phase of the divider 4 in accordance with the detected position of the word boundary indication data is complicated and this complicates the circuit.

SUMMARY OF THE INVENTION

It is an object of the present invention to provide a serial to parallel conversion apparatus which can perform desired serial to parallel conversion processing at a high speed while it has a simple and small-scale circuit configuration.

In order to attain the object described above, according to the present invention, there is provided a serial to parallel conversion apparatus for converting serial data including word boundary indication data indicative of a boundary position of a word into parallel data of m×n bits in units of a word, m and n being integers equal to or greater than 2, the serial to parallel conversion apparatus comprising first dividing means for dividing a first clock signal into m to produce a second clock signal and adjusting a phase of the second signal in accordance with a first phase adjustment signal, first serial to parallel conversion means for converting the serial data into parallel data of m bits in response to the second clock signal, m storage means each including a plurality of storage sections connected in series for receiving and storing different bits of the parallel data and successively shifting the stored bits in response to the second clock signal, second dividing means for dividing the first clock signal into m×n to produce a third clock signal and adjusting a phase of the third clock signal in accordance with a second phase adjustment signal, detection means for detecting the word boundary indication data based on outputs of the storage sections of the m storage means and producing the first phase adjustment signal and the second phase adjustment signal, and m second serial to parallel conversion means for receiving the different bits of the parallel data of m bits outputted from the last stage ones of the storage sections of the m storage means and each producing first parallel data of n bits in response to the third clock signal.

In the serial to parallel conversion apparatus, in the former stage, m-bit parallel data are produced by the first serial to parallel conversion means, and then in the latter stage, data of each bit of the parallel data are converted into n-bit parallel data by the second serial to parallel conversion means. Consequently, with the serial to parallel conversion apparatus, desired serial to parallel conversion processing can be performed at a high speed with a simple and small-scale circuit construction.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

Figure 1:
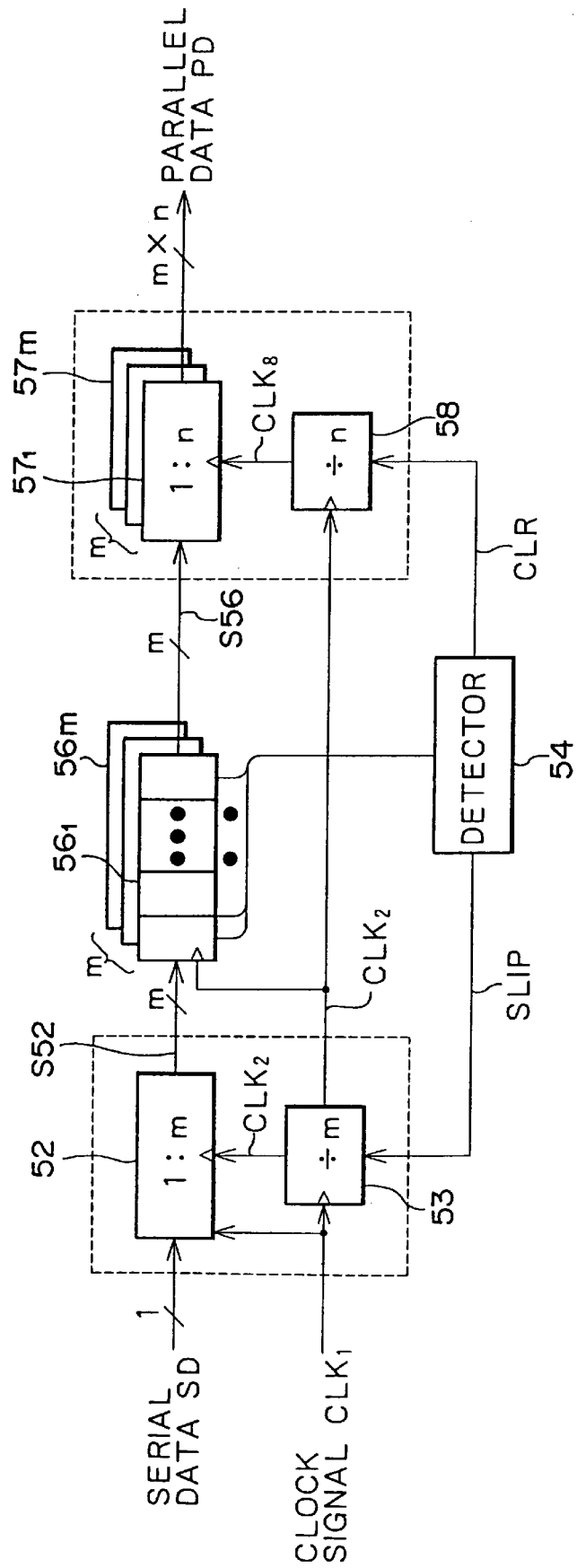
FIG. 1 is a block diagram showing a system construction of a serial to parallel conversion apparatus to which the present invention is applied.

Referring first to FIG. 1, there is shown a system construction of a serial to parallel conversion apparatus to which the present invention is applied.

The serial to parallel conversion apparatus is generally denoted at 51 and includes serial to parallel converters 52 and $57_1$ to $57_m$, a pair of dividers 53 and 58, a detector 54, and m shift registers $56_1$ to $56_m$.

The serial to parallel conversion apparatus 51 as first serial to parallel conversion means is provided, for example, in a receiver and receives, as input serial data SD, a video signal of three primary colors of R, G and B over a monitor cable of copper lines.

In this instance, in the receiver, a serial to parallel conversion apparatus for converting serial data into parallel data is incorporated.

The divider 53 as second dividing means receives a clock signal $CLK_1$ as a first clock signal and divides the clock signal $CLK_1$ into m to produce a clock signal $CLK_2$ as a second clock signal. The divider 53 outputs the clock signal $CLK_2$ thus produced to the serial to parallel converter 52, shift registers $5_1$ to $5_m$ and divider 58. Further, the divider 53 initializes the phase of the clock signal $CLK_2$ in response to a pulse included in a slip signal SLIP from the detector 54.

The serial to parallel converter 52 successively receives serial data SD of 1 bit, converts the received serial data SD into parallel data S52 of m bits in response to the clock signals $CLK_1$ and $CLK_2$, and outputs the individual bit data of the serial data SD to corresponding ones of the shift registers $56_1$ to $56_m$.

The shift registers $56_1$ to $56_m$ which serve as storage means are each composed of a plurality of flip-flops connected in series and individually shift corresponding bit data of the parallel data S52 inputted thereto successively to the following flip-flops in response to the clock signal $CLK_2$.

The detector 54 serving as detection means monitors stored data of the shift registers $56_1$ to $56_m$ and produces a clear signal CLR and a slip signal SLIP, each of which presents a pulse at a predetermined timing, in response to word boundary indication data. The detector 54 outputs the clear signal CLR to the divider 58 and outputs the slip signal SLIP to the divider 53.

The divider 58 serving as second dividing means receives the clock signal $CLK_2$, divides the clock signal $CLK_2$ into n to produce a clock signal $CLK_8$ as a third clock signal and outputs the clock signal $CLK_8$ to the serial to parallel converters $57_1$ to $57_m$. Further, the divider 58 is reset in response to a pulse included in the clear signal CLR.

It is to be noted that the divider 58 may produce the clock signal $CLK_8$ not from the clock signal $CLK_2$ but alternatively from the clock signal $CLK_1$.

The serial to parallel converters $57_1$ to $57_m$ as second serial to parallel conversion means individually receive corresponding bits of parallel data S56 outputted from the shift registers $56_1$ to $56_m$ in series, individually produce parallel signals of n bits in response to the clock signal $CLK_8$ and output the resulting parallel signals. Consequently, the serial to parallel converters $57_1$ to $57_m$ output parallel data PD of m×n bits.

Figure 2:
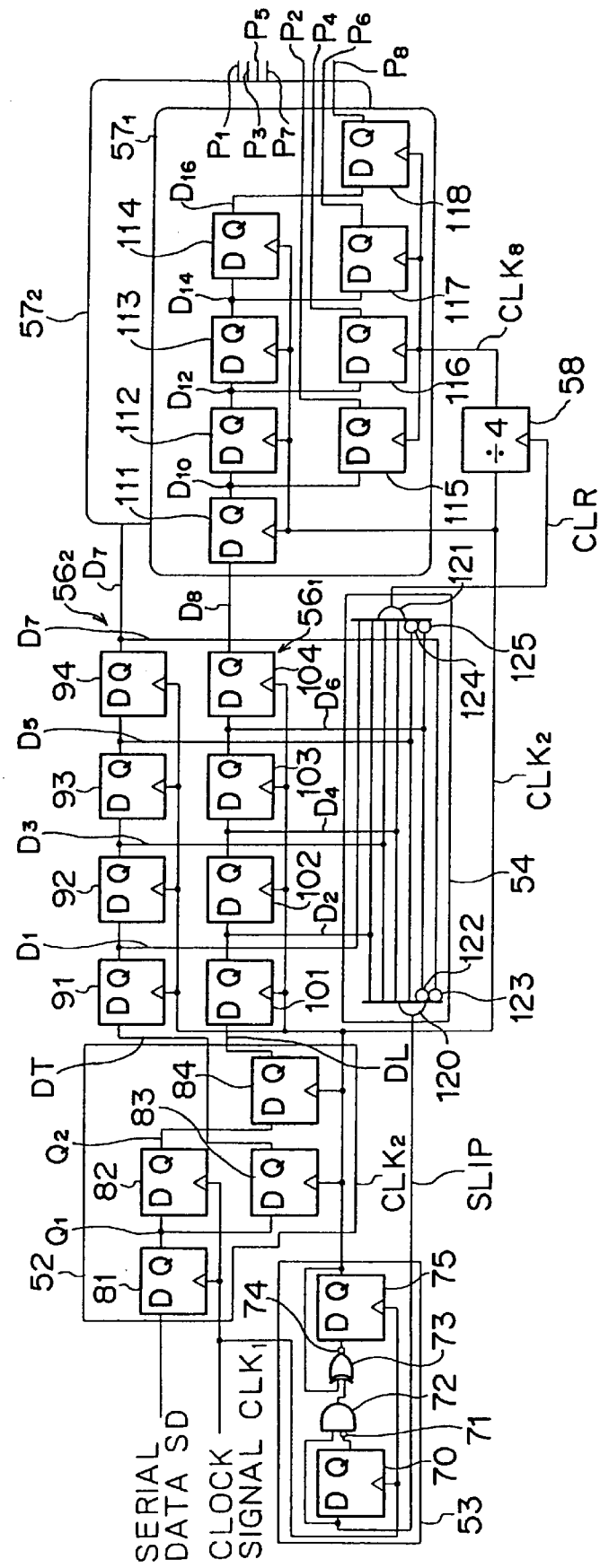
FIG. 2 is a circuit diagram of the serial to parallel conversion apparatus shown in FIG. 1 where m=2 and n=4.

FIG. 2 is a circuit diagram of the serial to parallel conversion apparatus 51 shown in FIG. 1 where m=2 and n=4.

Where m=2 and n=4, the serial to parallel conversion apparatus 51 includes serial to parallel converters 52, $57_1$ and $57_2$, a pair of dividers 53 and 58, a detector 54 and a pair of shift registers $56_1$ and $56_2$ as seen from FIG. 2.

In particular, since m=2, the numbers of the shift registers and the serial to parallel converters in the following stage provided in the serial to parallel conversion apparatus 51 are 2.

As seen from FIG. 2, the divider 53 includes a pair of D type flip-flops (D-FFs) 70 and 75, a pair of NOT circuits 71 and 74, an AND circuit 72, and an exclusive OR (XOR) circuit 73.

The Q terminal of the D-FF 70 is connected to one of a pair of input terminals of the AND circuit 72 through the NOT circuit 71.

The output terminal of the AND circuit 72 is connected to one of a pair of input terminals of the XOR circuit 73. The output terminal of the XOR circuit 73 is connected to the D terminal of the D-FF 75 through the NOT circuit 74. The Q terminal of the D-FF 75 is connected to the other input terminal of the XOR circuit 73 and the CLK terminals of the D-FFs 83 and 84.

The clock signal $CLK_1$ is supplied to the CLK terminals of the D-FF 70 and 75. Meanwhile, the slip signal SLIP is supplied to the D terminal of the D-FF 70 and the other input terminal of the AND circuit 72.

The serial to parallel converter 52 includes D-FFs 81, 82, 83 and 84.

The serial data SD are supplied to the D terminal of the D-FF 81, and the Q terminal of the D-FF 81 is connected to the D terminals of the D-FFs 82 and 83. The Q terminal of the D-FF 82 is connected to the D terminal of the D-FF 84, and the Q terminal of the D-FF 84 is connected to the D terminal of a D-FF 101 of the shift register $56_1$.

The Q terminal of the D-FF 83 is connected to the D terminal of a D-FF 91 of the shift register $56_2$.

The clock signal $CLK_1$ is supplied to the CLK terminals of the D-FFs 81 and 82, and the clock signal $CLK_2$ is supplied to the CLK terminals of the D-FFs 83 and 84.

The shift register $56_1$ includes D-FFs 101, 102, 103 and 104.

To the D terminal of the D-FF 101, a DL signal is inputted from the Q terminal of the D-FF 84. The Q terminal of the D-FF 101 is connected to the D terminal of the D-FF 102, and the Q terminal of the D-FF 102 is connected to the D terminal of the D-FF 103 while the Q terminal of the D-FF 103 is connected to the D terminal of the D-PF 104. The Q terminal of the D-FF 104 is connected to the D terminal of a D-FF 111 of the serial to parallel converter 57$_1$.

To the CLK terminals of the D-FFs 101, 102, 103 and 104, the clock signal CLK$_2$ is inputted.

The shift register 56$_2$ includes D-FFs 91, 92, 93 and 94.

To the D terminal of the D-FF 91, a DT signal is inputted from the Q terminal of the D-FF 83. The Q terminal of the D-FF 91 is connected to the D terminal of the D-FF 92 and the Q terminal of the D-FF 92 is connected to the D terminal of the D-FF 93 while the Q terminal of the D-FF 93 is connected to the D terminal of the D-FF 94. The Q terminal of the D-FF 94 is connected to the D terminal of the D-FF 111 of the serial to parallel converter 57$_2$. To the CLK terminals of the D-FFs 91, 92, 93 and 94, the clock signal CLK$_2$ is supplied.

The detector 54 includes a pair of AND circuits 120 and 121 each having 6 inputs and one output.

The six input terminals of the AND circuit 120 are connected to the Q terminals of the D-FFS 101, 92, 102 and 93 and to the Q terminals of the D-FFs 103 and 94 through NOT circuits 122 and 123, respectively. The output terminal of the AND circuit 120 is connected to the D terminal of the D-FF 70 of the divider 53.

Meanwhile, the six input terminals of the AND circuit 121 are connected to the Q terminals of the D-FFs 91, 101, 92 and 102 and to the Q terminals of the D-FFs 93 and 103 through NOT circuits 124 and 125, respectively. The output terminal of the AND circuit 121 is connected to the divider 58.

The serial to parallel converters 57$_1$ includes D-FFs 111, 112, 113, 114, 115, 116, 117 and 118.

The Q terminal of the D-FF 111 is connected to the D terminals of the D-FFs 112 and 115. The Q terminal of the D-FF 112 is connected to the D terminal of the D-FF 113, and the Q terminal of the D-FF 113 is connected to the D terminal of the D-FF 114 while the Q terminal of the D-FF 114 is connected to the D terminal of the D-FF 118.

The D terminal of the D-FF 116 is connected to the Q terminal of the D-FF 112. The D terminal of the D-FF 117 is connected to the Q terminal of the D-FF 113. The D terminal of the D-FF 118 is connected to the Q terminal of the D-FF 114.

To the CLK terminals of the D-FFs 111, 112, 113 and 114, the clock signal CLK$_2$ is supplied from the divider 53. Meanwhile, to the CLK terminals of the D-FFs 115, 116, 117 and 118, the clock signal CLK$_8$ is supplied from the divider 58.

The serial to parallel converters 57$_1$ receives data D$_8$, D$_6$, D$_4$, D$_2$ serially from the shift register 56$_1$ and outputs parallel data P$_8$, P$_6$, P$_4$, P$_2$ of 4 bits.

The serial to parallel converter 57$_2$ has a basically same construction as the serial to parallel converter 57$_1$, and receives data D$_7$, D$_5$, D$_3$, D$_1$ serially from the shift register 56$_2$ and outputs parallel data P$_7$, P$_5$, P$_3$, P$_1$ of 4 bits.

In the following, operation of the serial to parallel conversion apparatus 51 shown in FIG. 2 is described.

Figure 3:
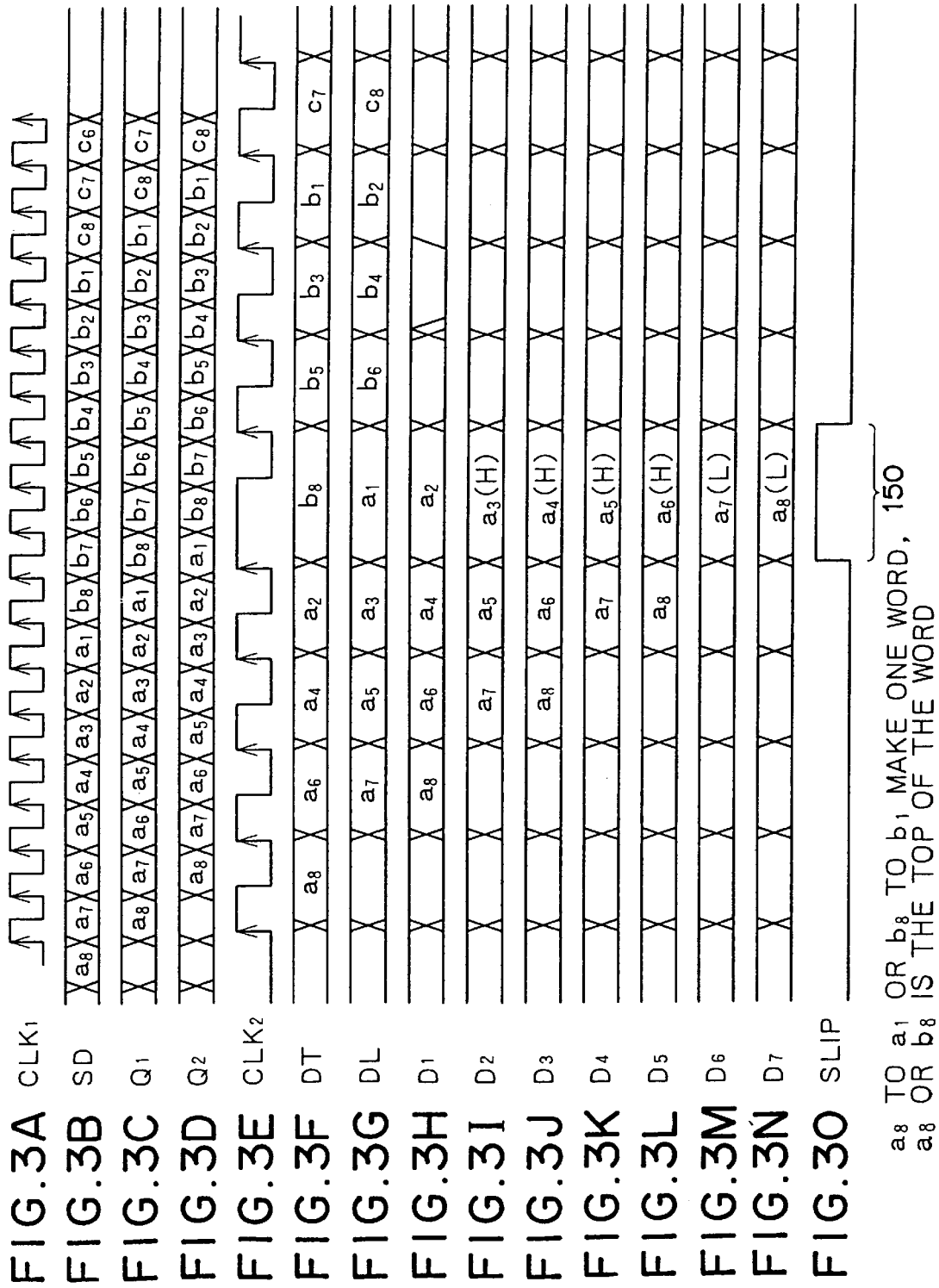
FIGS. 3A through 3O are timing-charts illustrating operation of the serial to parallel conversion apparatus of FIG. 2 until it produces a slip signal from serial data.
Figure 4:
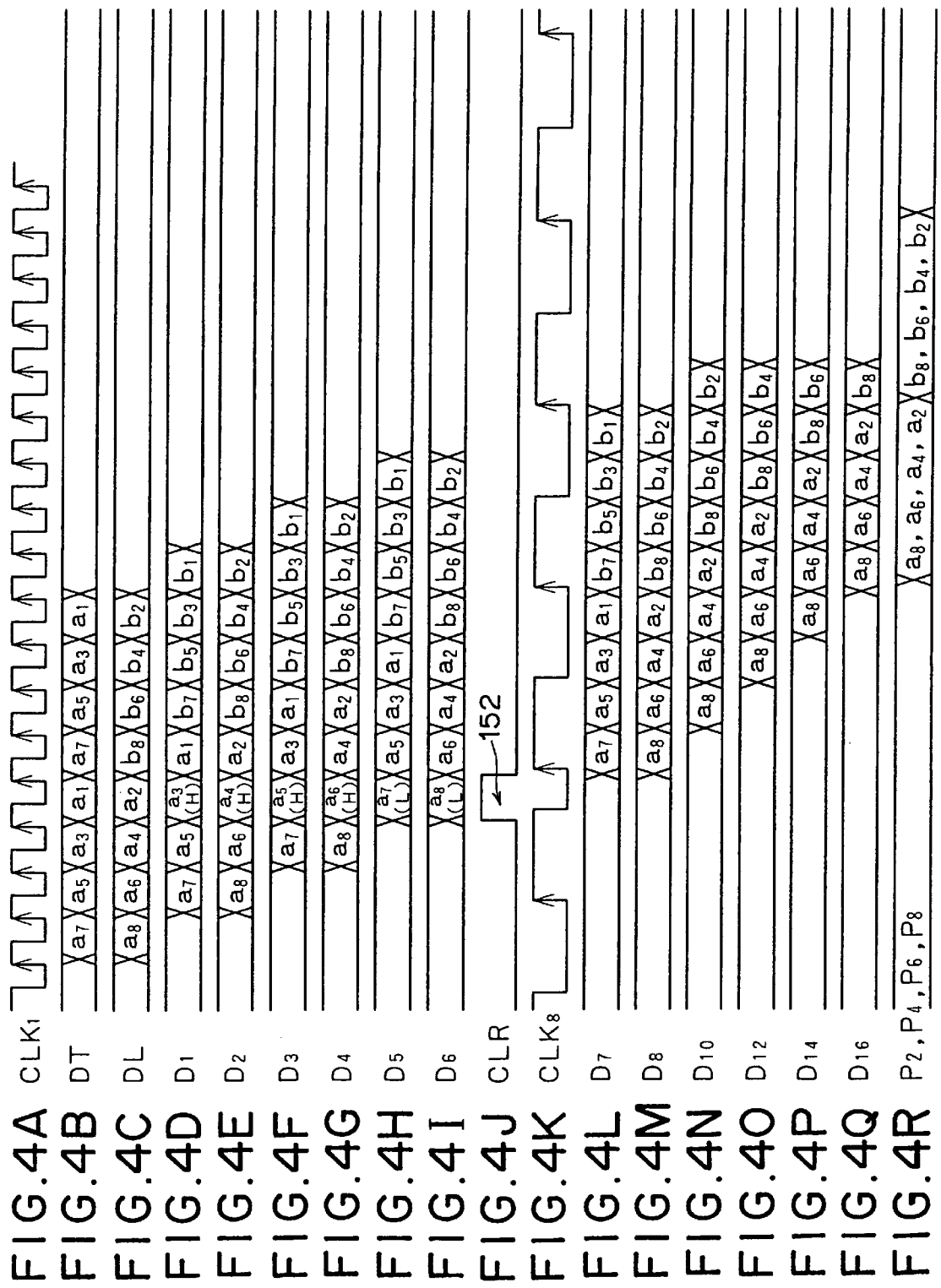
FIGS. 4A through 4R are similar timing-charts but illustrating operation of the serial to parallel conversion apparatus of FIG. 2 until it produces parallel data from data of shift registers.

FIGS. 3A through 3O are timing-charts illustrating operation of the serial to parallel conversion apparatus 51 until the slip signal SLIP is produced from the serial data SD, and FIGS. 4A through 4R are timing-charts illustrating operation of the serial to parallel conversion apparatus 51 until the parallel data P$_1$ to P$_8$ are produced from the data D$_1$ to D$_8$ of the shift registers 56$_1$ and 56$_2$.

The divider 53 produces the clock signal CLK$_1$ shown in FIG. 3E by dividing the clock signal CLK$_1$ shown in FIG. 3A into 2. Here, the period of the clock signal CLK$_1$ is defined as one clock cycle.

As seen in FIG. 3B, data b$_1$ to b$_8$ and a$_1$ to a$_8$ of the serial data SD are inputted to the serial to parallel converter 52 at the timings of rising edges of the clock signal CLK$_1$.

The data b$_1$ to b$_8$ and a$_1$ to a$_8$ of the serial data SD inputted to the serial to parallel converter 52 are each delayed by one clock cycle by the D-FF 81 and outputted as data Q$_1$ shown in FIG. 3C to the D terminals of the D-FFs 82 and 83.

Further, the data Q$_1$ are delayed by one clock cycle by the D-FF 82 and outputted as data Q$_2$ shown in FIG. 3D to the D terminal of the D-FF 84.

Then, the D-FF 83 outputs the data Q$_1$ as data DT shown in FIG. 3F at timings of rising edges of the clock signal CLK$_2$ to the D terminal of the D-FF 91.

In this instance, since the period of the clock signal CLK$_2$ is 2 clock cycles which are equal to twice the period of the clock signal CLK$_2$, the data DT are those data of the alternate data a$_8$, a$_6$, a$_4$, ... included in the data Q$_1$ which are individually held for two clock cycles.

Further, the D-FF 84 outputs the data Q$_2$ as data DL shown in FIG. 3G to the D terminal of the D-FF 101 at the timings of rising edges of the clock signal CLK$_2$.

In this instance, since the period of the clock signal CLK$_2$ is equal to twice the period of the clock signal CLK$_2$, the data DL are those data of the alternate data a$_7$, a$_5$, a$_3$, ... included in the data Q$_2$ which are individually held for two clock cycles.

The data DT are delayed by 2 clock cycles in response to the clock signal CLK$_2$ by the D-FF 91 and outputted as data D$_1$ shown in FIG. 3H.

The data D$_1$ are delayed by 2 clock cycles in response to the clock signal CLK$_2$ by the D-FF 92 and outputted as data D$_3$ shown in FIG. 3J.

The data D$_3$ are delayed by 2 clock cycles in response to the clock signal CLK$_2$ by the D-FF 93 and outputted as data D$_5$ shown in FIG. 3L.

The data D$_5$ are delayed by 2 clock cycles in response to the clock signal CLK$_2$ by the D-FF 94 and outputted as data D$_7$ shown in FIG. 3N.

Meanwhile, the data DL are delayed by 2 clock cycles in response to the clock signal CLK$_2$ by the D-FF 101 and outputted as data D$_2$ shown in FIG. 3I.

The data D$_2$ are delayed by 2 clock cycles in response to the clock signal CLK$_2$ by the D-FF 102 and outputted as data D$_4$ shown in FIG. 3K.

The data D$_4$ are delayed by 2 clock cycles in response to the clock signal CLK$_2$ by the D-FF 103 and outputted as data D$_6$ shown in FIG. 3M.

The data D$_6$ are delayed by 2 clock cycles in response to the clock signal CLK$_2$ by the D-FF 104 and outputted as data D$_6$.

The data D$_2$, D$_3$, D$_4$ and D$_5$ are inputted to the input terminals of the AND circuit 120 while the data D$_6$, and D$_7$ are inputted through the NOT circuit 122 and 123, respectively, to the input terminals of the AND circuit 120.

Then, if the data D$_2$, D$_3$, D$_4$, D$_5$, D$_6$ and D$_7$ become the H, H, H, H, L and L levels in a clock cycle 150, then the slip signal SLIP from the output terminal of the AND circuit 120 becomes the high level as seen in FIGS. 3H through 3O.

Consequently, the phase of the clock signal CLK$_2$ is inverted as seen in FIG. 3E, and data following the data C$_8$ are outputted as data DT and DL of a correctly delimited word as seen in FIGS. 3F through 3G.

Thereafter, the data DT are successively delayed by the D-FFs 91, 92, 93 and 94 each by 2 clock cycles in response to the clock signal CLK$_2$ and outputted as data D$_1$, D$_3$, D$_5$ and D$_7$ from the D-FFs 91, 92, 93 and 94 as seen in FIGS. 4D, 4F, 4H and 4L respectively.

Simultaneously, the data DL are successively delayed by the D-FFs 101, 102, 103 and 104 each by 2 clock cycles in response to the clock signal $CLK_2$ and outputted as data $D_2$, $D_4$, $D_6$ and $D_8$ from the D-FFs 101, 102, 103 and 104 as seen in FIGS. 4E, 4G, 4I and 4M respectively.

Then, if the data $D_1$, $D_2$, $D_3$, $D_4$, $D_5$ and $D_6$ become the H, H, H, H, L and L levels in another clock cycle 152, then the clear signal CLR from the output terminal of the AND circuit 121 becomes the high level as seen in FIGS. 4D through 4I.

Consequently, as seen in FIG. 4K, the phase of the clock signal $CLK_8$ is reset, and as seen in FIGS. 4L and 4M data following the data a, are fetched as data $D_7$ and $D_8$ of a correctly delimited word to the D terminal of the D-FF 111 of the serial to parallel converters $57_1$ and is outputted from the Q terminal of the D-FF 111. In other words, data $D_{10}$ are outputted from the Q terminal of the D-FF 111 at the tining indicated in FIG. 4N. Further, the data $D_{10}$ are successively delayed by the D-FFs 112, 113 and 114 each by 2 clock cycles, and data $D_{12}$, $D_{14}$ and $D_{16}$ are outputted from the D-FFs 112, 113 and 114 as seen in FIGS. 4O through 4Q respectively.

Further, the data $D_{10}$, $D_{12}$, $D_{14}$ and $D_{16}$ are outputted in parallel as data $P_2$, $P_4$, $P_6$ and $P_8$ from the Q terminals of the D-FFs 115, 116, 117 and 118 in response to the clock signal $CLK_8$ as seen in FIG. 4R.

Also the serial to parallel converter $57_2$ performs processing of the data $D_7$ which is similar to the processing by the serial to parallel converter $5_1$ and outputs data $P_1$, $P_3$, $P_5$ and $P_7$ in parallel.

As described above, with the serial to parallel conversion apparatus 51 shown in FIG. 2, since the number of positions of word boundary indication data which may possibly appear in the flip-flops which form the two shift registers $56_1$ and $56_2$ is 2 and the operation frequencies of the serial to parallel converter 52 and $57_1$ to $57_2$, shift registers $56_1$ and $56_2$ and detector 54 can be reduced to one half, the construction of the shift registers $56_1$ and $56_2$ and the detector 54 shown in FIG. 2 can be simplified and reduced in scale. As a result, when compared with conventional apparatus, the construction of the serial to parallel conversion apparatus 51 can be simplified and reduced in scale, and the speed of the serial data SD can be raised.

A modification to the serial to parallel conversion apparatus 51 described above is described below.

Figure 5:
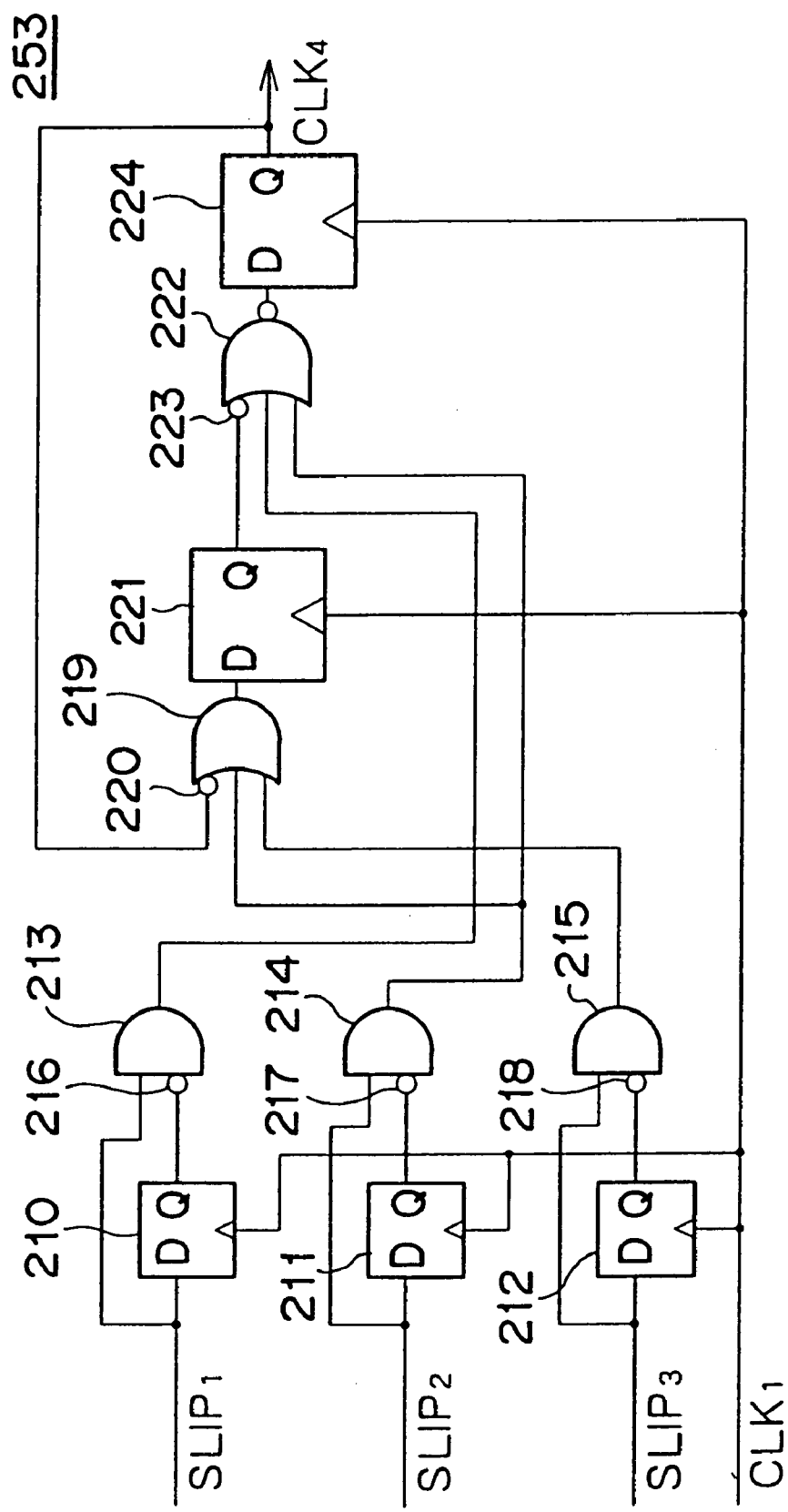
FIG. 5 is a circuit diagram of a divider of the serial to parallel conversion apparatus of FIG. 1 where m=4.
Figure 6:
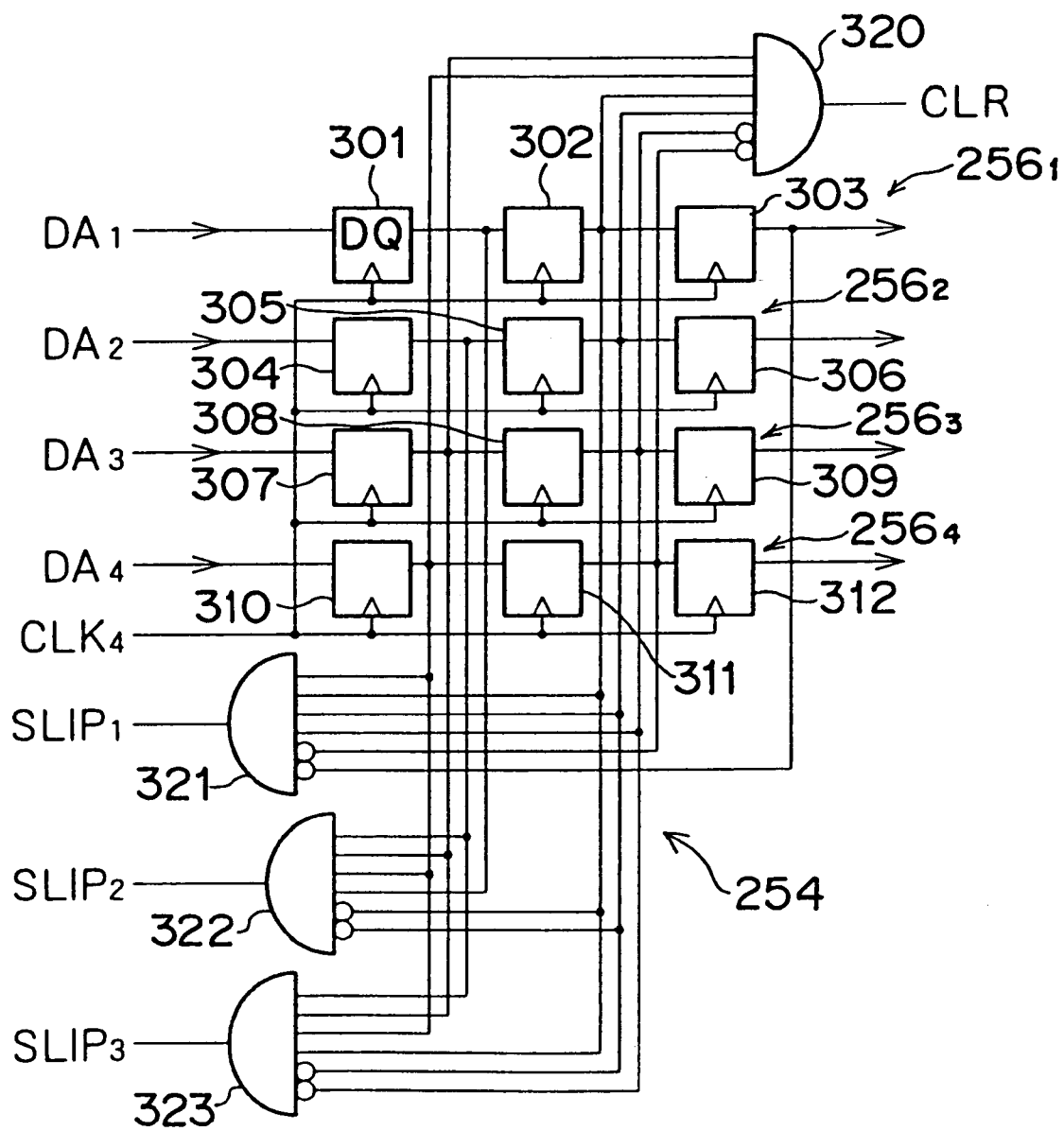
FIG. 6 is a circuit diagram of the shift register and a detector of the serial to parallel conversion apparatus of FIG. 1 where m=4.
Figure 7:
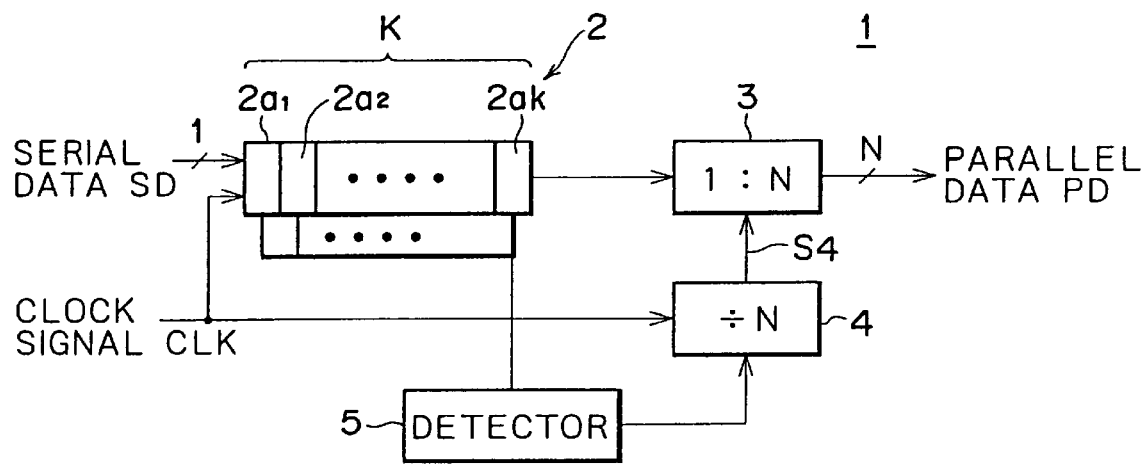
FIG. 7 is a block diagram of a conventional serial to parallel conversion apparatus.
Figure 8:
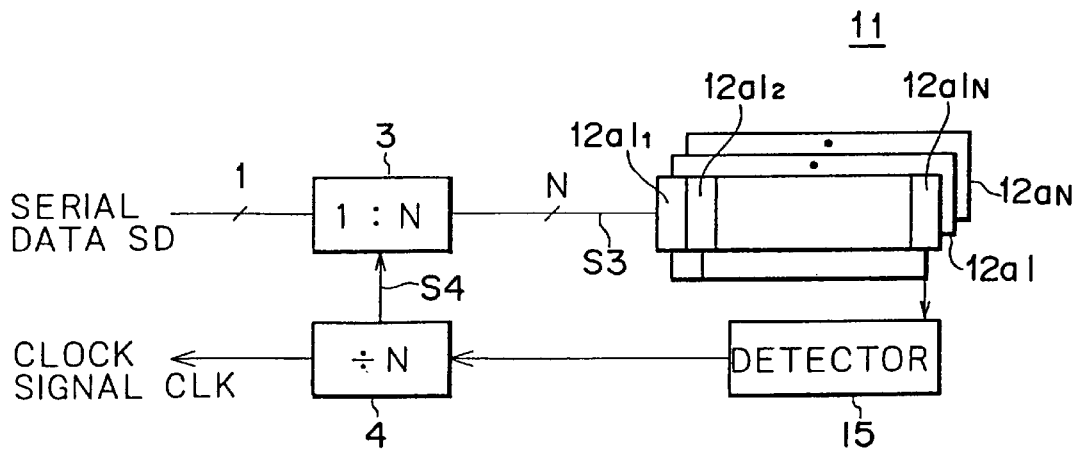
FIG. 8 is a block diagram of another conventional serial to parallel conversion apparatus.

For example, where m=4 and n=4, the divider 53 shown in FIG. 1 has such a circuit construction as that of a divider 253 shown in FIG. 5 while the shift registers $56_1$ to $56_m$ and the detector 54 shown in FIG. 1 have such constructions of shift registers $256_1$ to $256_4$ and a detector 254 as shown in FIG. 6.

Further, in this instance, the serial to parallel converter 52 of the serial to parallel conversion apparatus 51 shown in FIG. 1 converts serial data SD into and outputs parallel data composed of data $DA_1$, $DA_2$, $DA_3$ and $DA_4$ illustrated in FIG. 6. It is to be noted that the flip-flops which form the serial to parallel converter 52 operate in response to a clock signal $CLK_4$ from the divider 253 shown in FIG. 5. Here, the clock signal $CLK_4$ is a signal obtained by dividing the clock signal $CLK_1$ into 4.

Furthermore, in this instance, four serial to parallel converters $57_1$, $57_2$, $57_3$ and $57_4$ are provided. Further, the divider 58 divides the clock signal $CLK_4$ into 4 to produce a clock signal $CLK_{16}$. Flip-flops which compose the serial to parallel converters $57_1$, $57_2$, $57_3$ and $57_4$ operate in response to the clock signal $CLK_{16}$.

Consequently, the serial to parallel conversion apparatus 51 converts the serial data SD into and outputs parallel data of 16 bits $P_1$ to $P_{16}$.

In the following, a construction of the divider 253 shown in FIG. 5 is described.

In the divider 253, the Q terminal of a D-FF 210 is connected to one of a pair of input terminals of an AND circuit 213 through a NOT circuit 216, and the output terminal of the AND circuit 213 is connected to an input terminal of a NOR circuit 222.

A slip signal $SLIP_1$ from the detector 254 is inputted to the D terminal of the D-FF 210 and the other input terminal of the AND circuit 213.

The Q terminal of another D-FF 211 is connected to one of a pair of input terminals of another AND circuit 214 through a NOT circuit 217, and the output terminal of the AND circuit 214 is connected to an input terminal of an OR circuit 219 and another input terminal of the NOR circuit 222.

Another slip signal $SLIP_2$ from the detector 254 is inputted to the D terminal of the D-FF 211 and the other input terminal of the AND circuit 214.

The Q terminal of a further D-FF 212 is connected to one of a pair of input terminals of a further AND circuit 215 through a NOT circuit 218, and the output terminal of the AND circuit 215 is connected to another input terminal of the OR circuit 219.

A further slip signal $SLIP_3$ from the detector 254 is inputted to the D terminal of the D-FF 212 and the other input terminal of the AND circuit 215.

The remaining one of three input terminals of the OR circuit 219 is connected to the Q terminal of a D-FF 224 through a NOT circuit 220. The output terminal of the OR circuit 219 is connected to the D terminal of a D-FF 221, and the Q terminal of the D-FF 221 is connected to the remaining one of the input terminals of the NOR circuit 222 through a NOT circuit 223. The output terminal of the NOR circuit 222 is connected to the D terminal of the D-FF 224, and a clock signal $CLK_4$ is outputted from the Q terminal of the D-FF 224.

Further, the clock signal $CLK_1$ is outputted to the CLK terminals of the D-FFs 210, 211, 212, 221 and 224.

In the divider 253, the clock signal $CLK_1$ is divided into 4, and the resulting clock signal is corrected in phase by three different phase shifting operations with the slip signals $SLIP_1$, $SLIP_2$ and $SLIP_3$.

In other words, in order to perform serial to parallel conversion in accordance with word boundary indication data, three phases which are not synchronized with each other are corrected.

In the following, the shift registers $256_1$, $256_2$, $256_3$ and $256_4$ and the detector 254 shown in FIG. 6 are described.

In the shift register $256_1$, the data $DA_1$ from the serial to parallel converter 52 is inputted to the D terminal of a D-FF 301 while the D terminal of another D-FF 302 is connected to the Q terminal of the D-FF 301, and the D terminal of a further D-FF 303 is connected to the Q terminal of the D-FF 302. Output data from the Q terminal of the D-FF 303 is outputted to the serial to parallel converters $57_1$.

In the shift register $256_2$, the data $DA_2$ from the serial to parallel converter 52 is inputted to the D terminal of a D-FF 304 while the D terminal of another D-FF 305 is connected to the Q terminal of the D-FF 304, and the D terminal of a further D-FF 306 is connected to the Q terminal of the D-FF 305. Output data from the Q terminal of the D-FF 306 is outputted to the serial to parallel converter $57_2$.

In the shift register $256_3$, the data $DA_1$ from the serial to parallel converter 52 is inputted to the D terminal of a D-FF 307 while the D terminal of another D-FF 308 is connected to the Q terminal of the D-FF 307, and the D terminal of a further D-FF 309 is connected to the Q terminal of the D-FF 308. Output data from the Q terminal of the D-FF 309 is outputted to the serial to parallel converter 57$_3$.

In the shift register 256$_4$, the data DA$_4$ from the serial to parallel converter 52 is inputted to the D terminal of a D-FF 310 while the D terminal of another D-FF 311 is connected to the Q terminal of the D-FF 310, and the D terminal of a further D-FF 312 is connected to the Q terminal of the D-FF 311. output data from the Q terminal of the D-FF 312 is outputted to the serial to parallel converter 57$_4$.

Meanwhile, the detector 254 includes AND circuits 320, 321, 322 and 323.

The AND circuit 320 is connected to the Q terminal of the D-FF 310, the Q terminal of the D-FF 307, the Q terminal of the D-FF 302, the Q terminal of the D-FF 305, the Q terminal of the D-FF 308 through a NOT circuit and the Q terminal of the D-FF 311 through another NOT circuit, and outputs a clear signal CLR from the output terminal thereof.

The AND circuit 321 is connected to the Q terminal of the D-FF 310, the Q terminal of the D-FF 302, the Q terminal of the D-FF 305, the Q terminal of the D-FF 308, the Q terminal of the D-FF 311 through a NOT circuit and the Q terminal of the D-FF 303 through another NOT circuit, and outputs a slip signal SLIP$_1$ from the output terminal thereof.

The AND circuit 322 is connected to the Q terminal of the D-FF 301, the Q terminal of the D-FF 304, the Q terminal of the D-FF 307, the Q terminal of the D-FF 310, the Q terminal of the D-FF 302 through a NOT circuit and the Q terminal of the D-FF 305 through another NOT circuit, and outputs a slip signal SLIP$_2$ from the output terminal thereof.

The AND circuit 323 is connected to the Q terminal of the D-FF 304, the Q terminal of the D-FF 307, the Q terminal of the D-FF 310, the Q terminal of the D-FF 302, the Q terminal of the D-FF 305 through a NOT circuit and the Q terminal of the D-FF 308 through another NOT circuit, and outputs a slip signal SLIP$_3$ from the output terminal thereof.

The present invention is not limited to the embodiment described above.

For example, while, in the embodiment described above, description is given of the case wherein m=2 and n=4 and the case wherein m=4 and n=4, m and n are arbitrary integers equal to or larger than 2. Accordingly, the present invention can be applied, for example, to the case wherein m=2 and n=12.

By the way, with regard to a clock signal CLK$_m$ obtained by dividing the clock signal CLK$_1$ into m, the number of different available conditions of phases which are not in synchronism with word boundary indication data is m−1, Therefore, in this instance, m−1 phase shifts must be realized.

Here, since the number of different positions of word boundary indication data which may appear in m shift registers is m and the operating frequency of the serial to parallel converters 52 and 57$_1$ to 57$_m$, shift registers 56$_1$ to 56$_m$ and detector 54 can be reduced to 1/m, if m is a small integer, then the construction of the shift registers 56$_1$ to 56$_m$ and detector 54 shown in FIG. 1 can be simplified and reduced in scale. As a result, when compared with the prior art, the construction of the serial to parallel conversion apparatus 51 can be simplified and reduced in scale and the speed of the serial data SD can be raised.

It is to be noted that, if m is set to a high value, then the operating frequency of the serial to parallel converters 52 and 57$_1$ to 57$_m$, shift registers 56, to 56$_m$ and detector 54 can be lowered, and as a result, high speed processing can be achieved. However, this increases the numbers of the shift registers 56$_1$ to 56$_m$ and the serial to parallel converters 57$_1$ to 57$_m$ and complicates the detection processing by the detector 54.

Accordingly, in the serial to parallel conversion apparatus 51, the values of m and n are determined by tradeoff between increase in speed and reduction in scale.

What is claimed is:

1. A serial to parallel conversion apparatus for converting serial data including word boundary indication data indicative of a boundary position of a word into parallel data of m×n bits in units of a word, m and n being integers equal to or greater than 2, said serial to parallel conversion apparatus comprising:

first dividing means for dividing a first clock signal into m to produce a second clock signal and adjusting a phase of the second clock signal in accordance with a first phase adjustment signal;

first serial to parallel conversion means for converting the serial data into parallel data of m bits in response to the second clock signal;

m storage means each including a plurality of storage sections connected in series for receiving and storing different bits of the parallel data and successively shifting the stored bits in response to the second clock signal;

second dividing means for dividing the first clock signal into m×n to produce a third clock signal and adjusting a phase of the third clock signal in accordance with a second phase adjustment signal;

detection means for detecting the word boundary indication data based on outputs of said storage sections of said m storage means and producing the first phase adjustment signal and the second phase adjustment signal; and m second serial to parallel conversion means for receiving the different bits of the parallel data of m bits outputted from the last stage ones of said storage sections of said m storage means and each producing first parallel data of n bits in response to the third clock signal.

2. A serial to parallel conversion apparatus according to claim 1, wherein said detection means produces the first phase adjustment signal which indicates a condition of phase displacement between the second clock signal and the word boundary indication data.

3. A serial to parallel conversion apparatus according to claim 2, wherein said detection means includes a plurality of detectors for detecting, where the phase displacement between the second clock signal and the word boundary indication data has a plurality of possible conditions, occurrence of the respective conditions of the phase displacement from the outputs of said storage sections, and produces the first phase adjustment signal which indicates a result of the detection by said plurality of detectors.

4. A serial to parallel conversion apparatus according to claim 1, wherein said detection means resets said second dividing means when first data of the word boundary indication data is outputted from the second last stage ones of said storage sections of said storage means.

5. A serial to parallel conversion apparatus according to claim 1, wherein said second dividing means divides the second clock signal from said first dividing means into n to produce the third clock signal.

6. A serial to parallel conversion apparatus according to claim 1, wherein said storage means are shift registers and said storage sections are flip-flops.

7. A serial to parallel conversion apparatus according to claim 1, wherein the serial data are video data of primary colors of R, G and B.

* * * * *